(12) United States Patent
Naito

(10) Patent No.: US 8,444,440 B2
(45) Date of Patent: May 21, 2013

(54) CONNECTOR

(75) Inventor: Takeharu Naito, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 257 days.

(21) Appl. No.: 12/939,311

(22) Filed: Nov. 4, 2010

(65) Prior Publication Data

US 2011/0111632 A1    May 12, 2011

(30) Foreign Application Priority Data

Nov. 10, 2009    (JP) .................................. 2009-257208

(51) Int. Cl.
*H01R 24/00*    (2011.01)

(52) U.S. Cl.
USPC ......................................................... 439/626

(58) Field of Classification Search
USPC .................. 439/626, 67, 577, 70, 593, 73, 74
See application file for complete search history.

(56) References Cited

U.S. PATENT DOCUMENTS

| | | | | |
|---|---|---|---|---|
| 5,427,537 A | * | 6/1995 | Savovic et al. .................. | 439/77 |
| 5,730,620 A | * | 3/1998 | Chan et al. ..................... | 439/526 |
| 2001/0000763 A1 | * | 5/2001 | Muramatsu ..................... | 439/74 |
| 2002/0173179 A1 | * | 11/2002 | Ito et al. .......................... | 439/70 |
| 2004/0048502 A1 | * | 3/2004 | Ohashi ............................ | 439/73 |

FOREIGN PATENT DOCUMENTS

JP    2005-340454 A    12/2005

* cited by examiner

*Primary Examiner* — Edwin A. Leon
(74) *Attorney, Agent, or Firm* — Holtz, Holtz, Goodman & Chick, P.C.

(57) ABSTRACT

A connector which makes it possible to facilitate the operation of mounting the connector, and reduce the mounting costs. An upper insulating film is affixed to upper surfaces of first and second contacts, and upper surfaces of carriers. Then, the first and second contacts, are disconnected from the carriers. Finally, a lower insulating film is affixed to lower surfaces of the first and second contacts, and lower surfaces of the carriers.

12 Claims, 15 Drawing Sheets

CONNECTOR

BACKGROUND OF THE INVENTION

1. Field of the Invention

This invention relates to a connector.

2. Description of the Related Art

Conventionally, there has been proposed a fixing device (connector) for an LED (light Emitting Diode) (see Japanese Laid-Open Patent Publication (Kokai) No. 2005-340454, Paragraphs 0014 to 0017, FIG. 1).

This fixing device is used for fixing an LED to a base part made of an insulating material, such as a housing of a tale lamp of a vehicle, and electrically connecting the LED and a power supply to each other, and includes a pair of lead frames which are integrally connected. One of the pair of lead frames has a shape in which the shape of the other of the pair of lead frames is inverted in respect of the right and left sides. One lead frame is the same in size as the other lead frame. The pair of lead frames are connected by a connection piece.

The pair of lead frames each include a frame body, a curling portion, and an elastic piece. The frame body is plate-shaped. The frame body is formed with screw holes. The curling portion is connected to the frame body, and holds the LED placed on the frame body in a manner capable of being inserted and removed. The elastic piece is connected to the frame body, and is brought into contact with an associated one of lead terminals of the LED held by the curling portion.

To mount the above-mentioned fixing device to the base part, first, screws inserted through the screw holes are screwed into screw holes in the base part to thereby fix the pair of lead frames to the base part, and then, the pair of lead frames which are integrally connected is divided into two separate lead frames by cutting the connection portion.

Although this fixing device is used as a connector for a tail lamp of a vehicle as mentioned above, to use this fixing device e.g. as a connector for an LED for backlight, it is necessary to provide an insulating plate between the pair of lead frames and a metallic chassis on which the pair of lead frames are mounted. Therefore, it is necessarily required to prepare the insulating plate suitable for mounting the pair of lead frames, and fix the insulating plate on the chassis by screws or the like.

Further, if the pair of lead frames is mounted on the chassis using the insulating plate, it is required to then perform the operation of dividing the pair of lead frames into two separate lead frames by cutting the connection portion which connects the pair of lead frames, and hence this makes the operation of mounting the lead frames on the chassis complicated.

SUMMARY OF THE INVENTION

The present invention has been made in view of these circumstances, and an object thereof is to provide a connector which makes it possible to make the operation of mounting the connector easy, and reduce the mounting costs.

To attain the above object, in a first aspect of the present invention, there is provided a connector comprising a first contact including a first contact portion which is brought into contact with one electrode of one object to be connected, a first holding portion which holds the one object to be connected, and a first connection portion which is connected to the other object to be connected, a second contact including a second contact portion which is brought into contact with another electrode of the one object to be connected, a second holding portion which holds the one object to be connected, and a second connection portion which is connected to the other object to be connected, and an insulating member that holds the first contact and the second contact with a predetermined spacing therebetween, the insulating member including a lower insulating film which is affixed to lower surfaces of the first and second contacts.

With the arrangement of the connector according to the first aspect of the present invention, before the connector is mounted on e.g. a metallic chassis, the lower insulating film of the insulating member is affixed to the lower surfaces of the first and second contacts as mentioned above, it is not necessary to provide an insulating plate between the first and second contacts, and the chassis. Further, the insulating member holds the first and second contacts with the predetermined spacing therebetween as mentioned above, whereby the first contact and the second contact are electrically disconnected from each other before mounting the connector on the chassis. This makes it unnecessary to divide the first contact and the second contact after mounting the connector on the chassis.

To attain the above object, in a second aspect of the present invention, there is provided a connector comprising a plurality of pairs of contacts, each pair being formed by a first contact and a second contact arranged with a predetermined spacing therebetween, the first contact including a first contact portion which is brought into contact with one electrode of one object to be connected, a first holding portion which holds the one object to be connected, and a first connection portion which is connected to the other object to be connected, the second contact including a second contact portion which is brought into contact with another electrode of the one object to be connected, a second holding portion which holds the one object to be connected, and a second connection portion which is connected to the other object to be connected, the first connection portion of the first contact of one of two adjacent pairs of the plurality of pairs of contacts being connected to the second connection portion of the second contact of the other of the two adjacent pairs, and an insulating member that holds the plurality of pairs of contacts, the insulating member including a lower insulating film which is affixed to lower surfaces of the first and second contacts.

In the first and second aspects of the present invention, preferably, the first and second holding portions are each supporting portions which receive the one object to be connected from a direction orthogonal to a direction of a thickness of the lower insulating film, and support the one object to be connected in the direction of the thickness of the lower insulating film, and the first and second contacts each include a positioning portion which positions the one object to be connected, which is received from the direction orthogonal to the direction of the thickness of the lower insulating film, and a retaining portion which prevents the one object to be connected, which is positioned by the positioning portion, from coming off in the direction orthogonal to the direction of the thickness of the lower insulating film.

In the first and second aspects of the present invention, preferably, the first and second holding portions are press-fitting portions which are relatively press-fitted into respective holes formed in the one object to be connected, in the direction of the thickness of the lower insulating film.

In the first and second aspects of the present invention, preferably, the first and second holding portions are bifurcated engaging portions which are relatively inserted while being elastically deformed into respective through holes formed in the one object to be connected, in the direction of the thickness of the lower insulating film, and are engaged with an upper surface of the one object to be connected.

In the first and second aspects of the present invention, preferably, the insulating member includes an upper insulating film which is affixed to upper surfaces of the first and second contacts, and the upper insulating film includes an exposing portion which causes at least the first and second contact portions and the first and second holding portions to be exposed.

In the first and second aspects of the present invention, preferably, the insulating member includes an upper insulating film which is affixed to upper surfaces of the first and second contacts, and the upper insulating film includes an exposing portion which causes at least the first and second contact portions, and the first and second holding portions to be exposed, the first and second contacts being provided with carriers which are separated from the first and second contacts, on opposite sides thereof, and the lower insulating film being affixed to lower surfaces of the carriers, and the upper insulating film being affixed to upper surfaces of the carriers.

To attain the above object, in a third aspect of the present invention, there is provided a method of producing a connector, comprising a first affixing step of affixing an upper insulating film to upper surfaces of first and second contacts which are arranged with a predetermined spacing therebetween, and upper surfaces of carriers which are located on opposite sides of the first and second contacts, and are continuous to the first and second contacts, a dividing step of disconnecting the first and second contacts, from the carriers, and a second affixing step of affixing a lower insulating film to lower surfaces of the first and second contacts, and lower surfaces of the carriers.

With the method according to the third aspect of the present invention, when attaching the connector e.g. to a metal chassis, it is not necessary to provide an insulating plate between the first and second contacts and the chassis. Further, when attaching the connector e.g. to a chassis, the worker does not need to divide the first contact and the second contact after mounting the connector on the chassis.

According to the present invention, it is possible to make the operation of mounting the connector easy, and reduce the mounting costs.

The above and other objects, features and advantages of the present invention will become more apparent from the following detailed description taken in conjunction with the accompanying drawings.

DETAILED DESCRIPTION OF THE PREFERRED EMBODIMENTS

The present invention will now be described in detail with reference to the drawings showing preferred embodiments thereof.

A description will be given of a connector according to a first embodiment of the present invention with reference to FIGS. 1 to 8.

Figure 1:
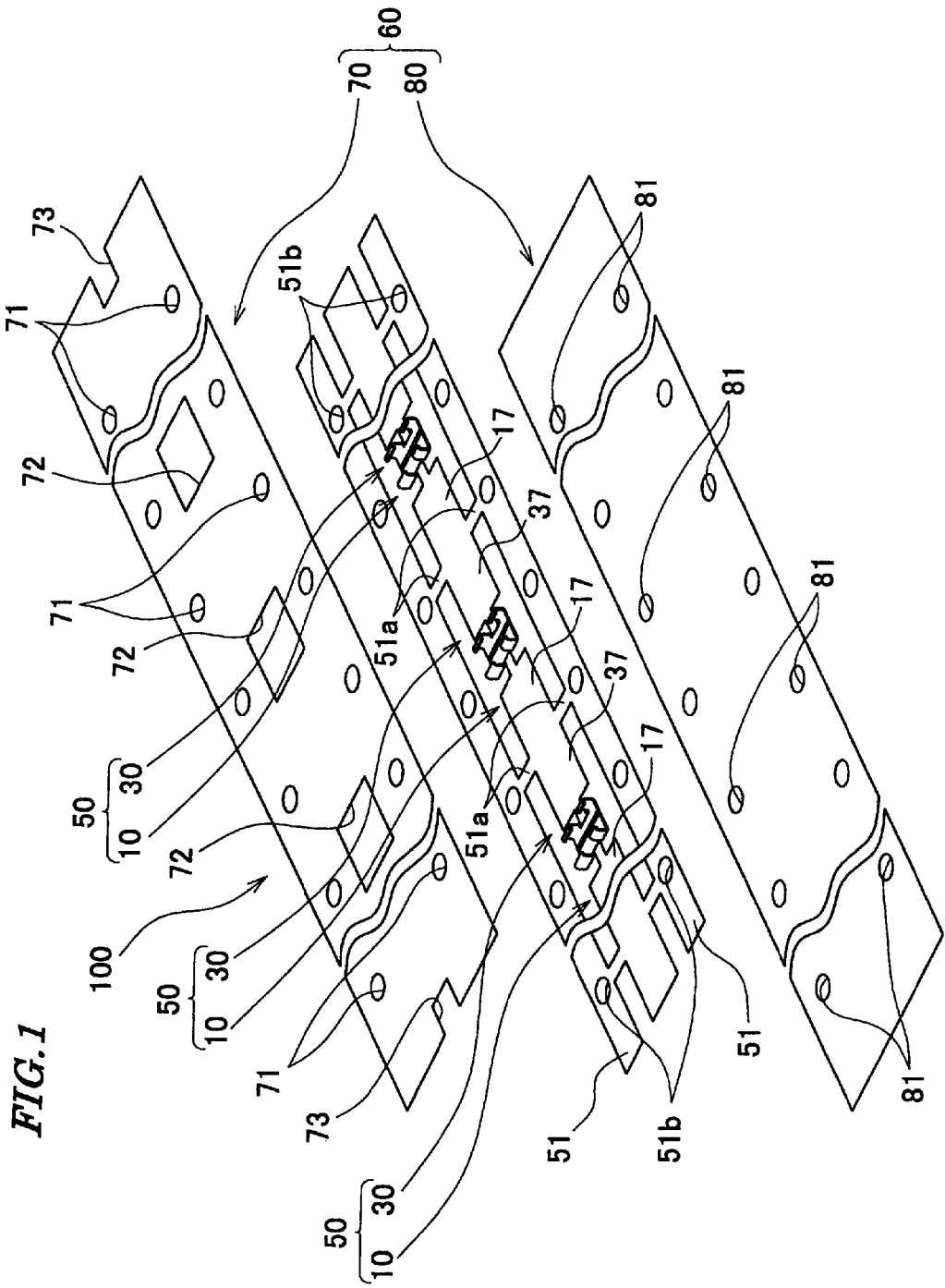
FIG. 1 is an exploded perspective view of a connector according to a first embodiment of the present invention.

As shown in FIG. 1, a connector 100 is comprised of a plurality of pairs of contacts 50 and a pair of insulating members 60. The connector 100 is a connector for e.g. a backlight of a liquid crystal display device, and is fixed to a metallic chassis (not shown) to have connected thereto in series a plurality of light-emitting diodes 1100 (see FIG. 2) as one objects to be connected.

The plurality of pairs of contacts 50 are each formed by blanking and bending one metal plate (not shown) having electrical conductivity and elasticity, with a pair of carriers 51.

Figure 2:
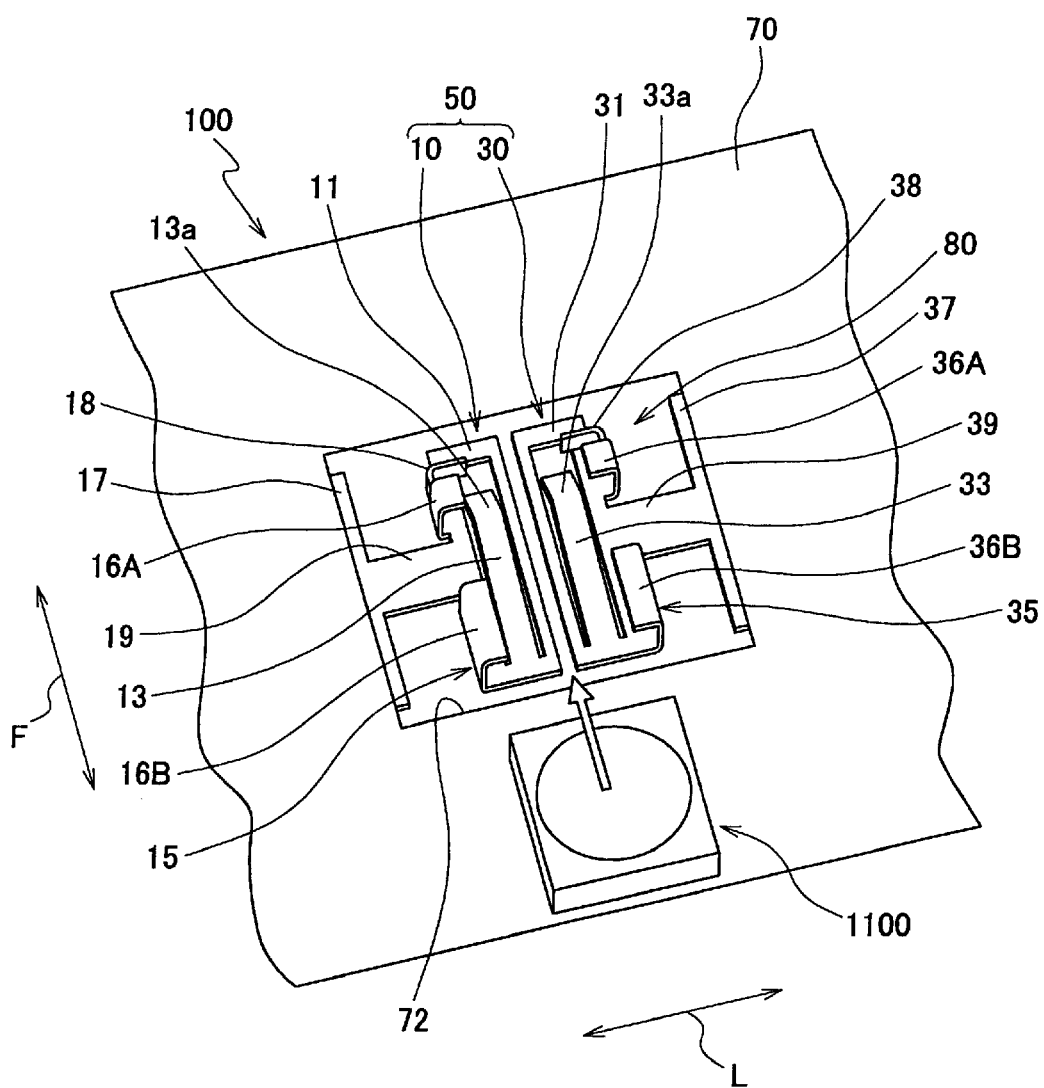
FIG. 2 is an enlarged perspective view of the connector shown in FIG. 1 in a state before causing a pair of contacts thereof to hold a light-emitting diode.
Figure 3:
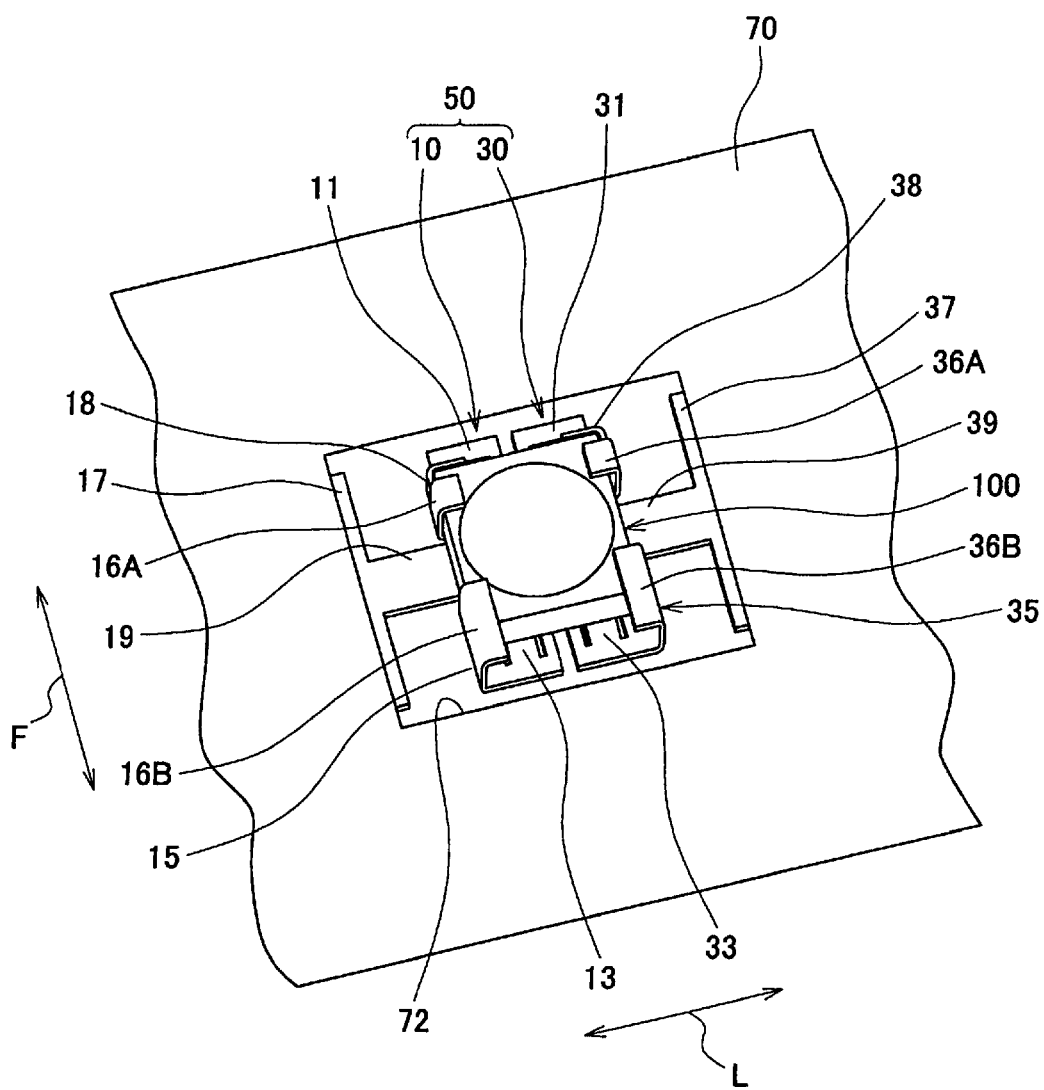
FIG. 3 is an enlarged perspective view of the connector shown in FIG. 1 in a state in which the light-emitting diode is held by the pair of contacts.

As shown in FIGS. 2 and 3, the plurality of pairs of contacts 50 are each formed by a first contact 10 and a second contact 30.

The first contact 10 includes a first base portion 11, a first contact portion 13, a front supporting portion 16A, a rear supporting portion 16B, a first connection portion 17, and a positioning portion 18.

The first base portion 11 is frame-shaped. The first contact portion 13 is bent into a substantially L-shape in cross-section. The first contact portion 13 extends in a front-rear direction F (see FIG. 2) of the connector 100 (in this embodiment, an upper part is the front, and a lower part is the rear, as viewed in FIG. 3). The first contact portion 13 is continuous with a rear portion of the first base portion 11, and a contact point 13a formed on the first contact portion 13 is positioned at a location higher than the first base portion 11.

The front supporting portion 16A is substantially L-shaped in cross-section, and is continuous with a front portion of the first base portion 11. The rear supporting portion 16B is substantially L-shaped in cross-section, and is continuous with a rear portion of the first base portion 11. A first supporting portion (first holding portion) 15 is formed by the first base portion 11, the front supporting portion 16A, and the rear supporting portion 16B. The first supporting portion 15 receives one side portion of the light-emitting diode 1100 along the front-rear direction F of the connector 100 in a manner capable of being inserted and removed.

The first connection portion 17 is plate-shaped. The positioning portion 18 is substantially L-shaped in cross-section, and is continuous with the front supporting portion 16A. A front surface of the light-emitting diode 1100 is brought into abutment with the positioning portion 18, whereby the position in the front-rear direction F of the light-emitting diode 1100 received by the first supporting portion 15 is determined. A first electrode (one electrode), not shown, which is formed on a bottom surface of the light-emitting diode 1100 positioned by the positioning portion 15 is brought into contact with the first contact portion 13.

The first connection portion 17 includes a linking portion 19. The linking portion 19 is plate-shaped, extends in a longitudinal direction L of the connector 100, and links (i.e. connects) between the first base portion 11 and the first connection portion 17.

The second contact 30 includes a second base portion 31, a second contact portion 33, a front supporting portion 36A, a rear supporting portion 36B, a second connection portion 37, and a positioning portion 38.

The second base portion 31 is frame-shaped. The second contact portion 33 is bent into a substantially L-shape in cross-section. The second contact portion 33 extends in the front-rear direction F. The second contact portion 33 is continuous with a rear portion of the second base portion 31, and a contact point 33a formed on the second contact portion 33 is positioned at a location higher than the second base portion 31.

The front supporting portion 36A is substantially L-shaped in cross-section, and is continuous with a front portion of the second base portion 31. The rear supporting portion 36B is substantially L-shaped in cross-section, and is continuous with a rear portion of the second base portion 31. A second supporting portion (second holding portion) 35 is formed by the second base portion 31, the front supporting portion 36A, and the rear supporting portion 36B. The second supporting portion 35 receives the other side portion of the light-emitting diode 1100 along the front-rear direction F of the connector 100 in a manner capable of being inserted and removed.

The second connection portion 37 is plate-shaped. The positioning portion 38 is substantially L-shaped in cross-section, and is continuous with the front supporting portion 36A. The front surface of the light-emitting diode 1100 is brought into abutment with the positioning portion 38, whereby the position in the front-rear direction F of the light-emitting diode 1100 received by the second supporting portion 35 is determined. A second electrode (the other electrode), not shown, which is formed on the bottom surface of the light-emitting diode 1100 positioned by the positioning portion 38 is brought into contact with the second contact portion 33.

The second connection portion 37 includes a linking portion 39. The linking portion 39 is plate-shaped, extends in the longitudinal direction L of the connector 100, and links (i.e. connects) between the second base portion 31 and the second connection portion 37.

Figure 4:
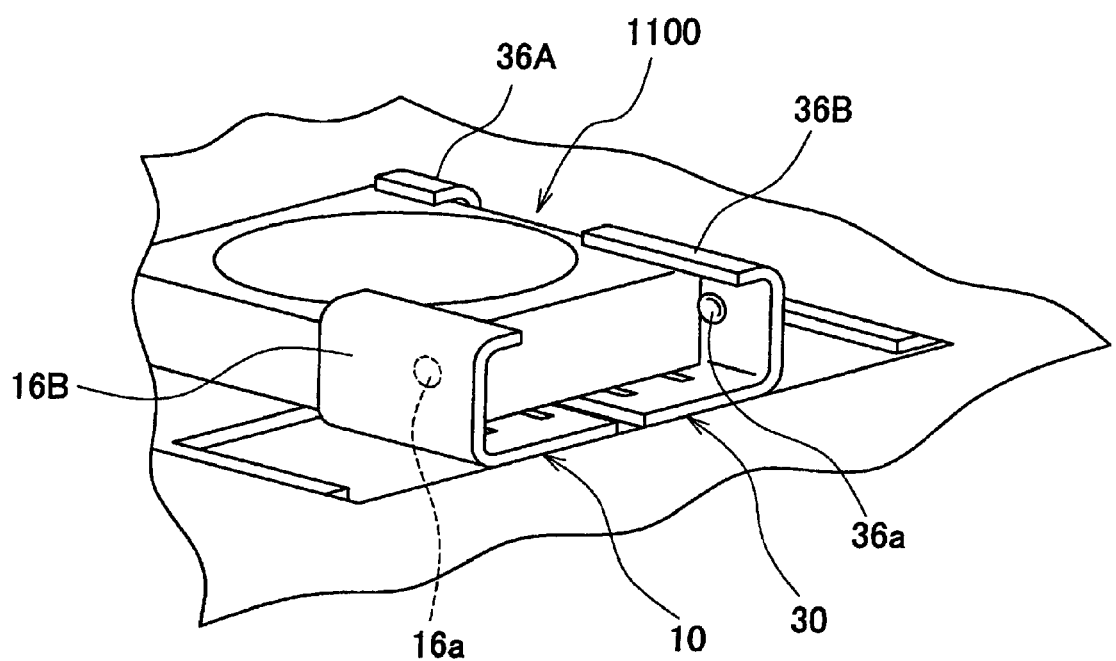
FIG. 4 is an enlarged perspective view of the connector shown in FIG. 1 in the state in which the light-emitting diode is held by the pair of contacts.

As shown in FIG. 4, retaining portions 16a and 36a are formed on respective inner surfaces of the rear supporting portions 16B and 36B. The retaining portions 16a and 36a are engaged with the opposite ends of the rear surface of the positioned light-emitting diode 1100, to thereby prevent the light-emitting diode 1100 from being removed from the first and second supporting portions 15 and 35.

As shown in FIG. 1, the first connection portion 17 of the first contact 10 of the adjacent one pair of contacts 50 and the second connection portion 37 of the second contact 30 of the other pair of contacts 50 are connected to each other. The plurality of pairs of contacts 50 shown in FIG. 1 are connected to each other in a series via the pair of carriers 51. Each carrier 51 includes linking portions 51a, each of which is continuous with a joining portion between the first connection portion 17 and the second connection portion 37. Each carrier is formed with bolt inserting holes 51b at equally-spaced intervals.

Figure 7:
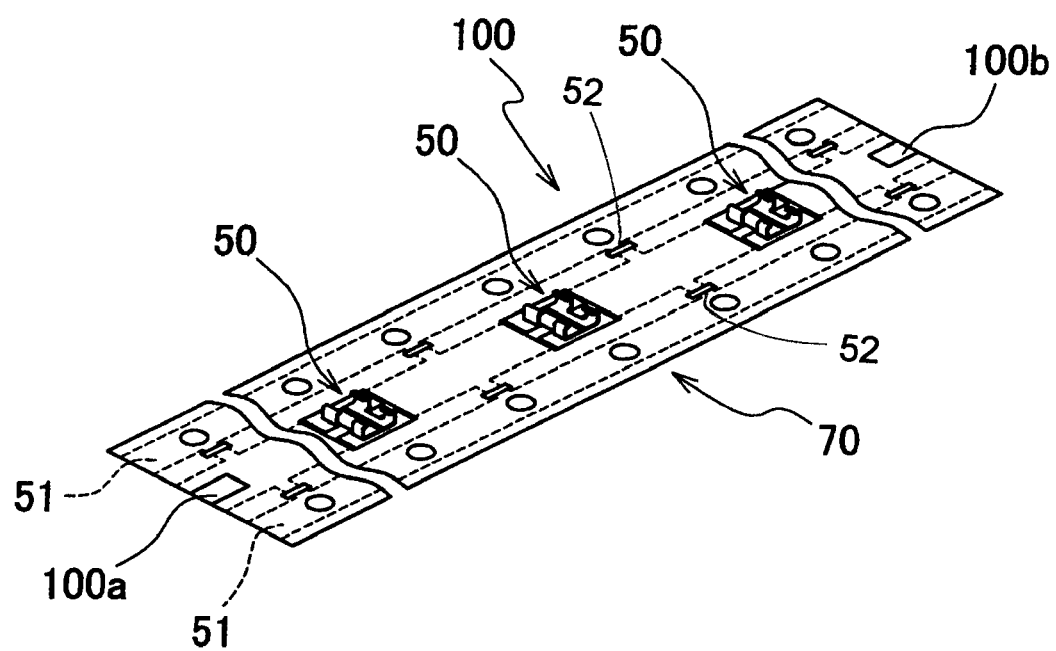
FIG. 7 is a perspective view of the connector shown in FIG. 5 in a state in which the plurality of pairs of contacts are disconnected from carriers.
Figure 8:
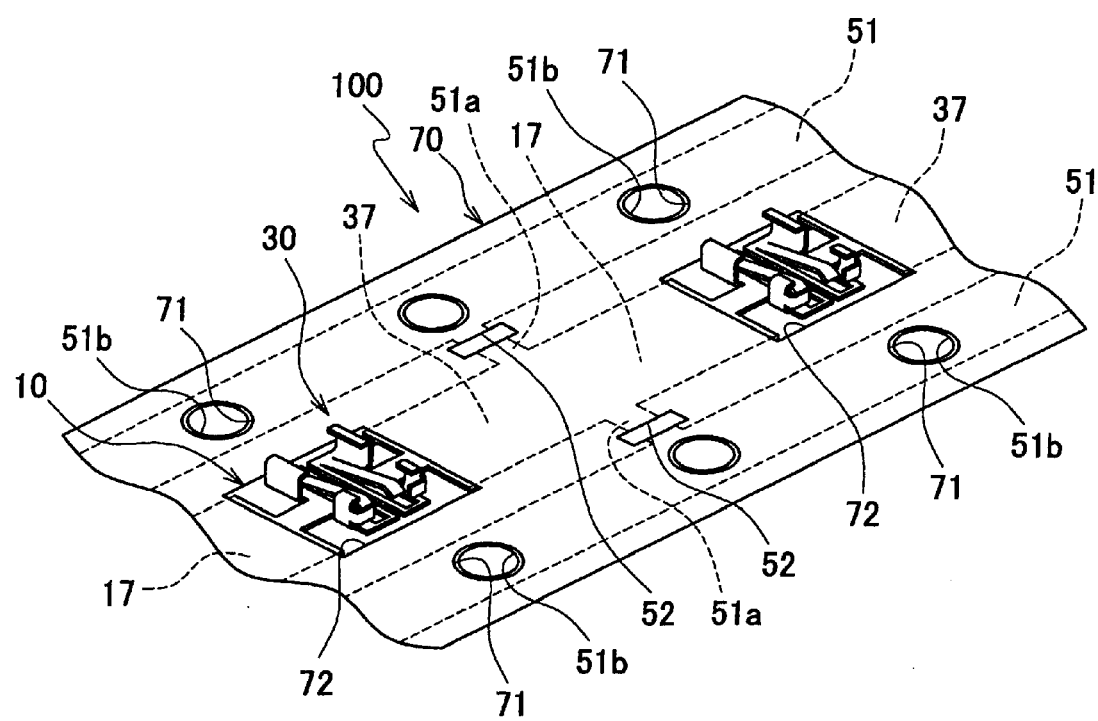
FIG. 8 is a partial enlarged view of the connector shown in FIG. 7.

It should be noted that holes 52 (see FIGS. 7 and 8), referred to hereinafter, are not shown in FIGS. 1, 5, and 6, so that the finished connector 100 is not shown in FIGS. 1, 5, and 6. On the other hand, FIGS. 7 and 8 show the finished connector 100.

The insulating member 60 is comprised of an upper insulating film 70 and a lower insulating film 80. The upper insulating film 70 is belt-shaped, and is formed with bolt inserting holes 71 at equally-spaced intervals through front and rear end portions thereof. The bolt inserting holes 71 are opposed to the bolt inserting holes 51b of the carrier 51. Further, the upper insulating film 70 is formed with window holes (exposing portion) 72 at equally-spaced intervals. The window holes 72 are opposed to the first and second contact portions 13 and 33, the first and second supporting portions 15 and 35, and so forth. Cutouts 73 are formed in the opposite ends of the upper insulating film 70. The lower insulating film 80 is belt-shaped, and is formed with bolt inserting holes 81 at equally-spaced intervals through front and rear end portions thereof. The bolt inserting holes 81 are opposed to the bolt inserting holes 51b of the carrier 51.

Next, a description will be given of a method for producing the connector 100.

First, the plurality of pairs of contacts 50 connected to each other via the carrier 51 in a series are formed by blanking and bending one metal plate.

Figure 5:
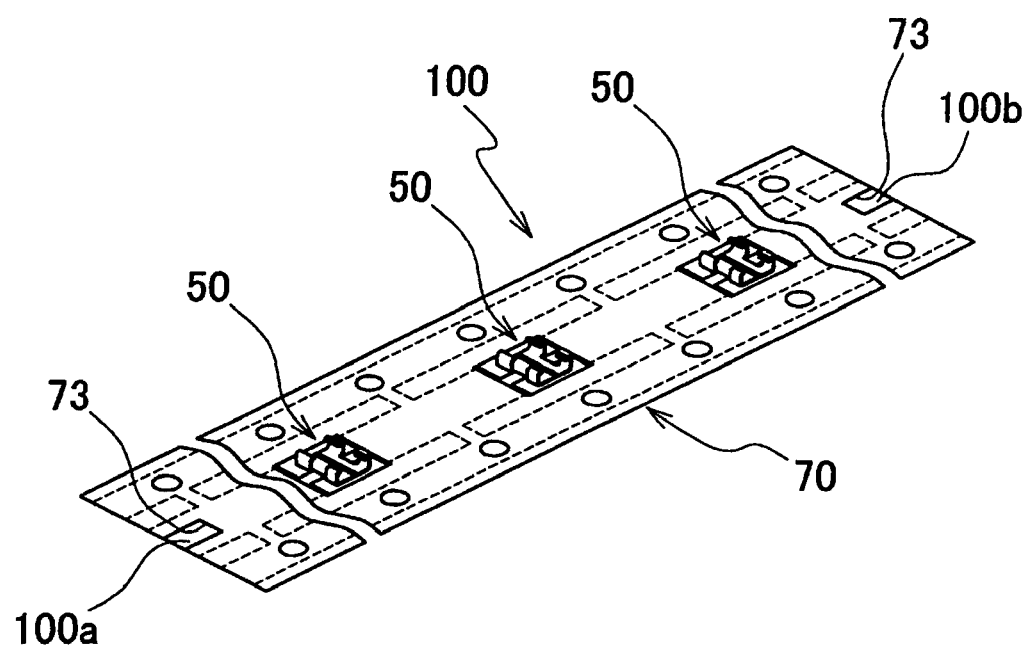
FIG. 5 is a perspective view of the connector shown in FIG. 1 in a state in which an upper insulating film is affixed to upper surfaces of the contacts.
Figure 6:
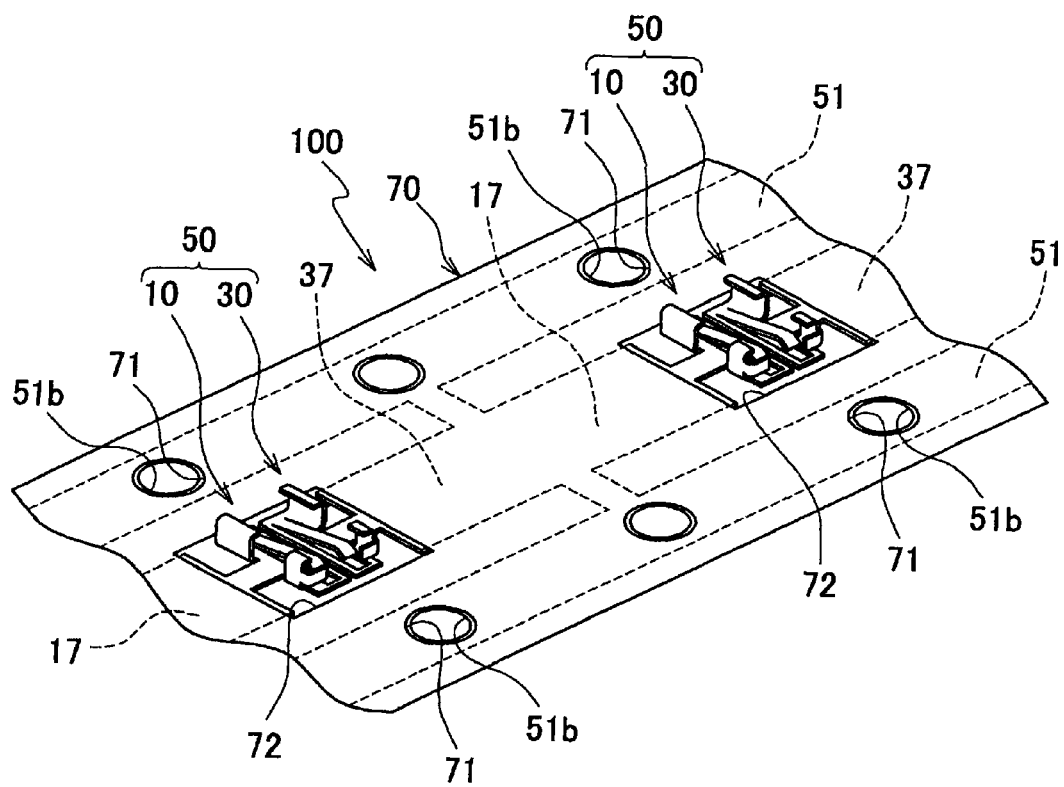
FIG. 6 is a partial enlarged view of the connector shown in FIG. 5.

Next, as shown in FIGS. 5 and 6, the upper insulating film 70 is affixed to the upper surfaces of the first and second contacts 10 and 30 of the pairs of contacts 50, and the upper surfaces of the carrier 51, with glue or double-sided tape (first affixing process). At this time, the upper insulating film 70 is affixed such that the bolt inserting holes 71 of the upper insulating film 70 are superposed on the bolt inserting holes 51b of the carrier 51. Further, the first and second base portions 11 and 31, the first and second contact portions 13 and 33, the front and rear supporting portions 16A and 16B, the front and rear supporting portions 36A and 36B, the positioning portions 18 and 38, and the linking portions 19 and 39 of the first and second contacts 10 and 30 are exposed to the outside through the window holes 71 of the upper insulating film 70.

When the upper insulating film 70 is affixed to the upper surfaces of the first and second contacts 10 and 30 of the pairs of contacts 50, and the upper surfaces of the carrier 51, a predetermined positional relation between the first contact 10 and the second contact 30 is maintained since the first and second contacts 10 and 30 are integrated via the carrier 51.

Further, since the upper insulating film 70 has the cutouts 73 formed in the opposite ends thereof, the opposite ends of the plurality of pairs of contacts 50 are exposed to the outside through the cutouts 73, and exposed portions form first and second terminals 100a and 100b of the connector 100 (see FIG. 5).

Next, as shown in FIGS. 7 and 8, the holes 52 are formed in the upper insulating film 70 and the linking portions 51a of the carrier 51 by blanking (dividing process). Each linking portion 51a is divided by the associated hole 52. As a result, the first contact 10 and the second contact 30 forming a pair are disconnected from each other, whereby each first contact 10 and the associated second contact 30 are insulated from each other. On the other hand, the first connection portion 17 of the first contact 10 of one of two adjacent pairs of the plurality of pairs of first and second contacts 10 and 30 is continuous with the second connection portion 37 of the second contact 30 of the other of the two adjacent pairs. Therefore, when one set of the plurality of contacts each formed by the first and second contacts 10 and 30 has the first and second terminals 100a and 100b thereof at the opposite ends connected to the power supply, if optical diodes are set to the respective contacts, these optical diodes are electrically connected in series.

Finally, the lower insulating film 80 is affixed to the lower surfaces of the first and second contacts 10 and 30 of the pairs of contacts 50, and the lower surfaces of the carrier 51 with glue or double-sided tape (second affixing process). As a result, the first and second connection portions 17 and 37 of the first and second contacts 10 and 30, and the carrier 51 are sandwiched and held by the upper insulating film 70 and the lower insulating film 80. Further, the holes 52 are covered by the lower insulting film 80.

The connector 100 is finished through the above-described processes.

The connector 100 is fixed to the metallic chassis (not shown) by bolts (not shown) which are inserted through the bolt inserting holes 51b, 71, and 81. Further, the first and second terminals 100a and 100b of the connector 100 are caused to be positioned on the reverse side of the chassis by bending the connection portions 17 and 37 inward of the first and second terminals 100a and 100b, thereby they are connected to the power supply (not shown) as the other object to be connected, which is provided on the reverse side of the chassis.

As shown in FIG. 2, to connect the light-emitting diode 1100 to the connector 100, it is only required to insert the light-emitting diode 1100 into the first and second supporting portions 15 and 35 along the front-rear direction F.

The light-emitting diode 1100 inserted in the first and second supporting portions 15 and 35 is brought into abutment with the positioning portions 18 and 38 and positioned, and is engaged with the retaining portions 16a and 36a (see FIG. 4) such that it becomes difficult to come off. The first electrode on the bottom surface of the light-emitting diode 1100 is brought into contact with the first contact portion 13, and the second electrode on the bottom surface of the light-emitting diode 1100 is brought into contact with the second contact portion 33, respectively, whereby the light-emitting diode 1100 and the power supply are electrically connected to each other.

According to the first embodiment, since the lower insulating film 80 of the insulating member 60 is affixed to the lower surfaces of the first and second contacts 10 and 30, when the connector 100 is mounted on e.g. a metallic chassis, it is not necessary to provide an insulating plate (not shown) between the first and second contacts 10 and 30, and the chassis. Further, as described above, the insulating member 60 holds the first and second contacts 10 and 30 with a predetermined spacing therebetween, whereby the first and second contacts 10 and 30 are disconnected from each other before mounting the connector 100 on the chassis, and hence when the connector 100 is mounted on the chassis, it is not necessary to divide the first contact 10 and the second contact 30. Therefore, this facilitates the operation of mounting the connector 100 easy, and reduces the mounting costs.

Further, the upper insulating film 70 is affixed to the upper surfaces of the first contact 10 and the second contact 30 in a state in which the first contact 10 and the second contact 30 are made integral by the carrier 51. Therefore, the upper insulating film 70 is affixed to the upper surfaces of the first contact 10 and the second contact 30, while maintaining the predetermined positional relation between the first contact 10 and the second contact 30.

Further, after affixing the upper insulating film 70 to the upper surfaces of the first and second contacts 10 and 30 and the upper surfaces of the carrier 51, the linking portions 51a are cut by forming the holes 52. Then, the lower insulating film 80 is affixed to the lower surfaces of the first and second contact 10 and 30 and the lower surfaces of the carrier 51. Therefore, the holes 52 are covered by the lower insulating film 80, whereby electric leakage is prevented.

Further, since the light-emitting diode 1100 is held by the first and second supporting portions 15 and 35 in a manner capable of being inserted and removed, this facilitates the mounting and removing of the light-emitting diode 1100, and it is possible to easily perform repairing or replacing the light-emitting diode 1100.

Further, it is possible to position the light-emitting diode 1100 by the positioning portions 18 and 38, and prevent the light-emitting diode 1100 from easily coming off from the connector 100, by the retaining portion 16a and 36a.

Further, since the first and second contacts 10 and 30 of the pairs of contacts 50, and the chassis are insulated by the lower insulating film 80, it is not necessary to provide an insulating plate between the connector 100 and the chassis, whereby it is possible to reduce the height of the connector 100, and effectively release heat generated by the light-emitting diodes 1100 to the chassis, which makes it possible to reduce the damage caused by the heat generated by the light-emitting diodes 1100.

It should be noted that although in the first embodiment, the retaining portions 16a and 36a, and the positioning portions 18 and 38 are employed, it is not necessarily required to provide the retaining portions 16a and 36a, and the positioning portions 18 and 38.

Further, although in the first embodiment, after affixing the upper insulating film 70 (first affixing process), the dividing operation (dividing process) is performed, and then the lower insulating film 80 is affixed (second affixing process), this is not limitative, but the dividing operation (dividing process) may be performed after affixing the lower insulating film 80 (second affixing process), and then, the upper insulating film 70 may be affixed (first affixing process), or the dividing operation (dividing process) may be performed after affixing the upper insulating film 70 and the lower insulating film 80 (first and second affixing processes).

Next, a description will be given of a second embodiment of the present invention with reference to FIGS. 9 to 11. Component parts identical to those of the connector according to the first embodiment are denoted by identical reference numerals, and detailed description thereof is omitted. It should be noted that in the connector shown in FIG. 9, the upper insulating film 70 is eliminated for clarity.

Figure 9:
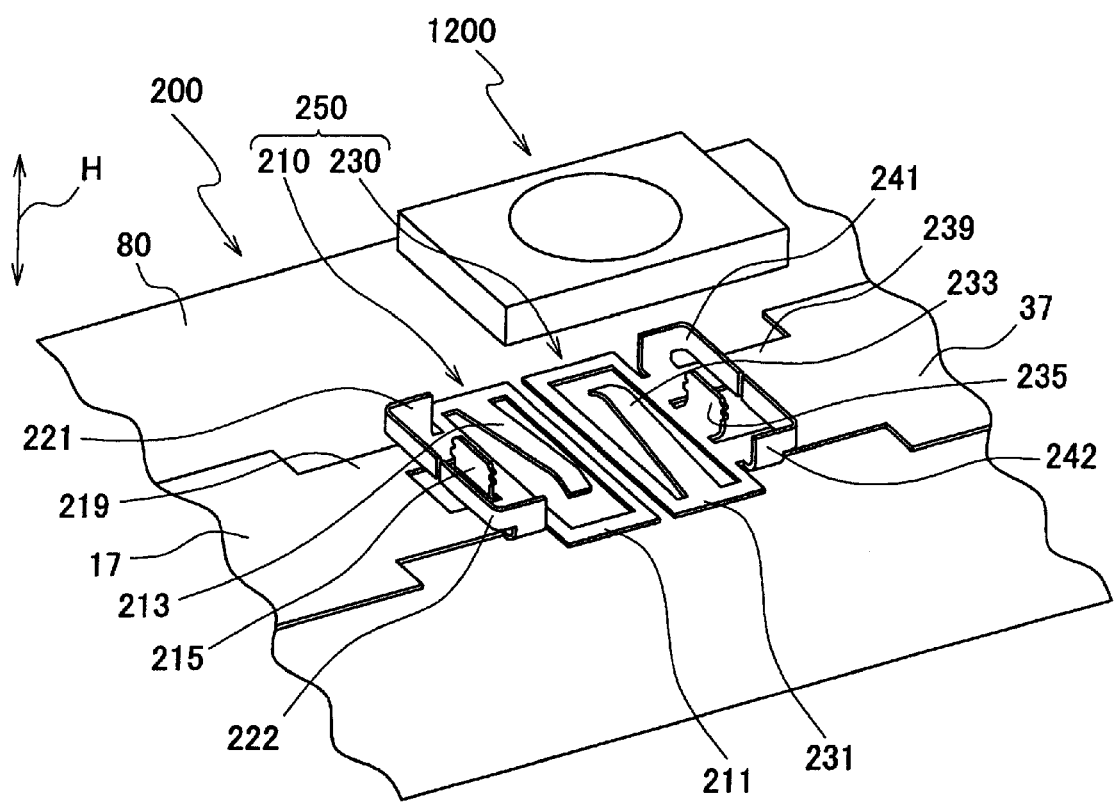
FIG. 9 is an enlarged perspective view of a connector according to a second embodiment of the present invention in a state before causing a pair of contacts thereof to hold a light-emitting diode.
Figure 10:
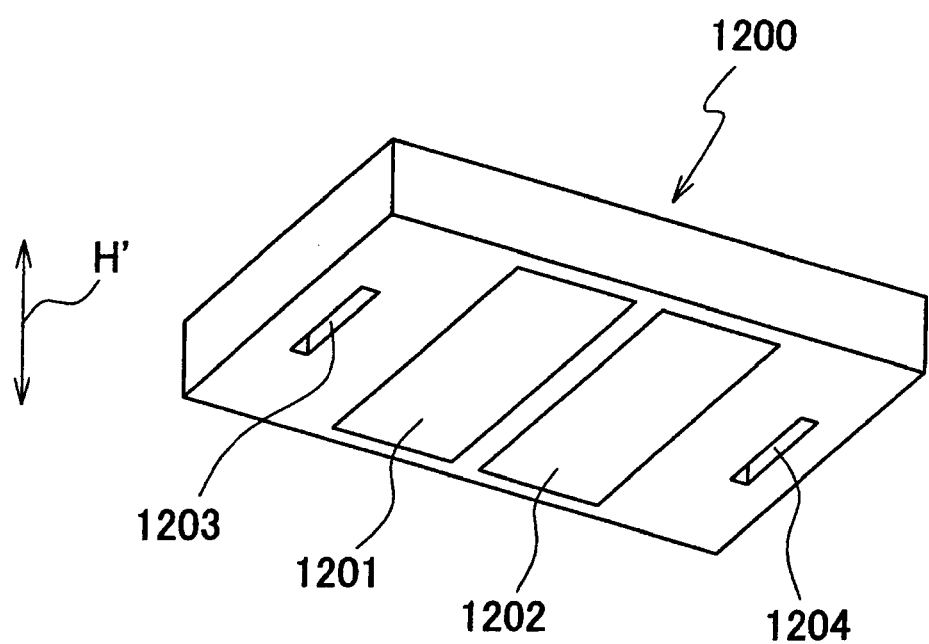
FIG. 10 is a perspective view of the light-emitting diode which is connected to the connector shown in FIG. 9 as viewed obliquely from the bottom.

In the second embodiment, as shown in FIG. 9, a first press-fitting portion 215 as a first holding portion of a pair of contacts 250 is continuous with a side portion of a first base portion 211 of a first contact 210, and extends in a direction H of the height of a connector 200. A second press-fitting portion 235 as a second holding portion of the pair of contacts 250 is continuous with a side portion of a second base portion 231 of a second contact 230, and extends in the direction H of the height. The first and second press-fitting portions 215 and 235 are relatively press-fitted into holes 1203 and 1204, respectively, which are formed in a bottom surface of a light-emitting diode 1200 (see FIG. 10) as one object to be connected. The holes 1203 and 1204 each have a predetermined depth in a direction H' of the height of the light-emitting diode 1200.

A first contact portion 213 is continuous with a front portion of the first base portion 211, and a second contact portion 233 is continuous with a rear portion of the second base portion 231. Therefore, the first contact portion 213 and the second contact portion 233 are arranged in directions opposite to each other. The first contact portion 213 is brought into contact with a first electrode 1201 (one electrode) on a bottom surface of the light-emitting diode 1200, and the second contact portion 233 is brought into contact with a second electrode 1202 (the other electrode) on the bottom surface of the light-emitting diode 1200.

A substantially L-shaped frame portion 221 is continuous with a front portion of a linking portion 219, and a substantially L-shaped frame portion 222 is continuous with a rear portion of the linking portion 219. A substantially L-shaped frame portion 241 is continuous with a front portion of a linking portion 239, and a substantially L-shaped frame portion 242 is continuous with a rear portion of the linking portion 239. The frame portions 221, 222, 241, and 242 receive the light-emitting diode 1200 in the direction H of the height.

Figure 11:
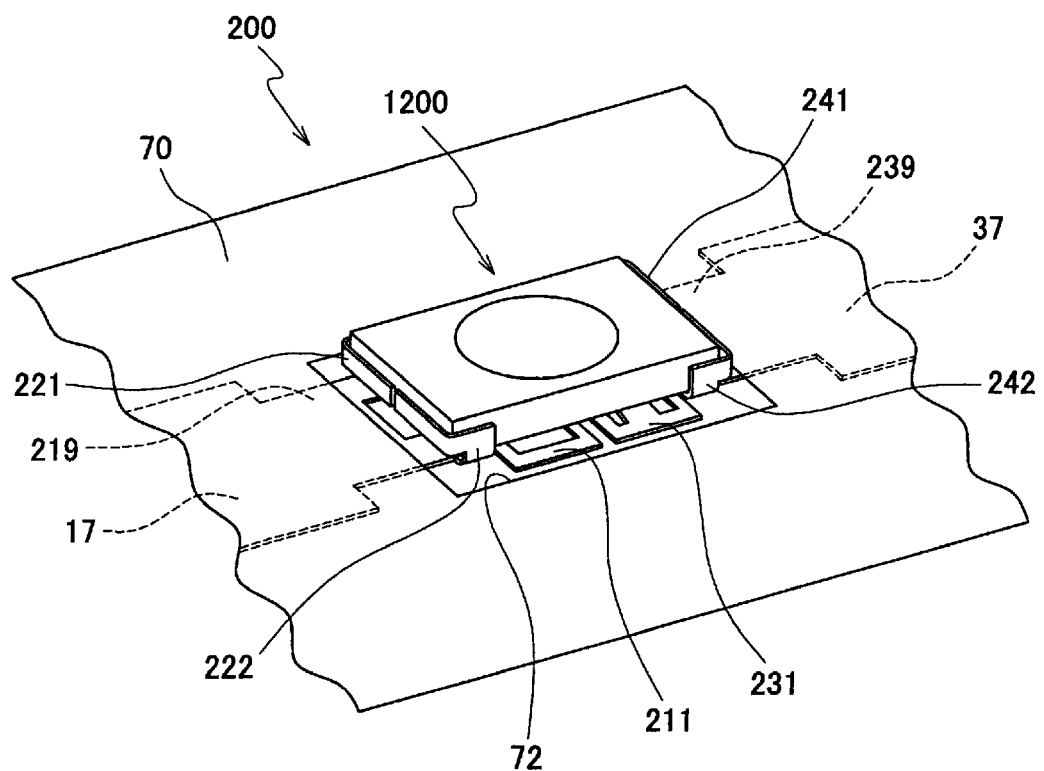
FIG. 11 is a perspective view of the connector shown in FIG. 9 in a state in which the light-emitting diode is connected thereto.

To connect the light-emitting diode 1200 to the connector 200, as shown in FIG. 11, it is only necessary to insert the light-emitting diode 1200 in an area surrounded by the frame portions 221, 222, 241, and 242 along the direction H of the height. At this time, the first and second press-fitting portions 215 and 235 are relatively press-fitted in the holes 1203 and 1204 of the light-emitting diode 1200, and the first and second contact portions 213 and 233 are respectively brought into contacts with the first and second electrodes 1201 and 1202 of the light-emitting diode 1200.

According to the second embodiment, it is possible to obtain the same advantageous effects as provided by the first embodiment.

Next, a description will be given of a connector according to a third embodiment of the present invention with reference to FIGS. 12 to 15. Component parts identical to those of the connector according to the first embodiment are denoted by identical reference numerals, and detailed description thereof is omitted. It should be noted that in the connector shown in FIG. 12, the upper insulating film is eliminated for clarity.

Figure 12:
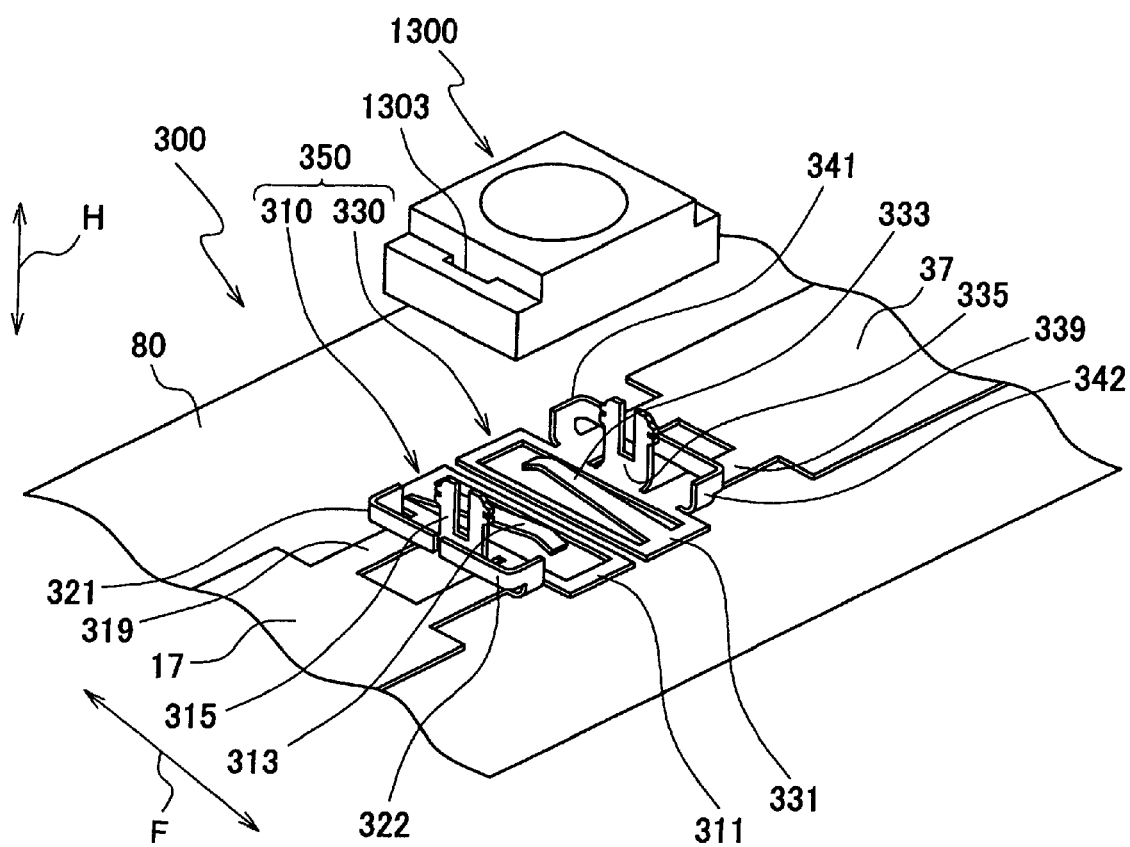
FIG. 12 is an enlarged perspective view of a connector according to a third embodiment of the present invention in a state before causing a pair of contacts thereof to hold a light-emitting diode.
Figure 13:
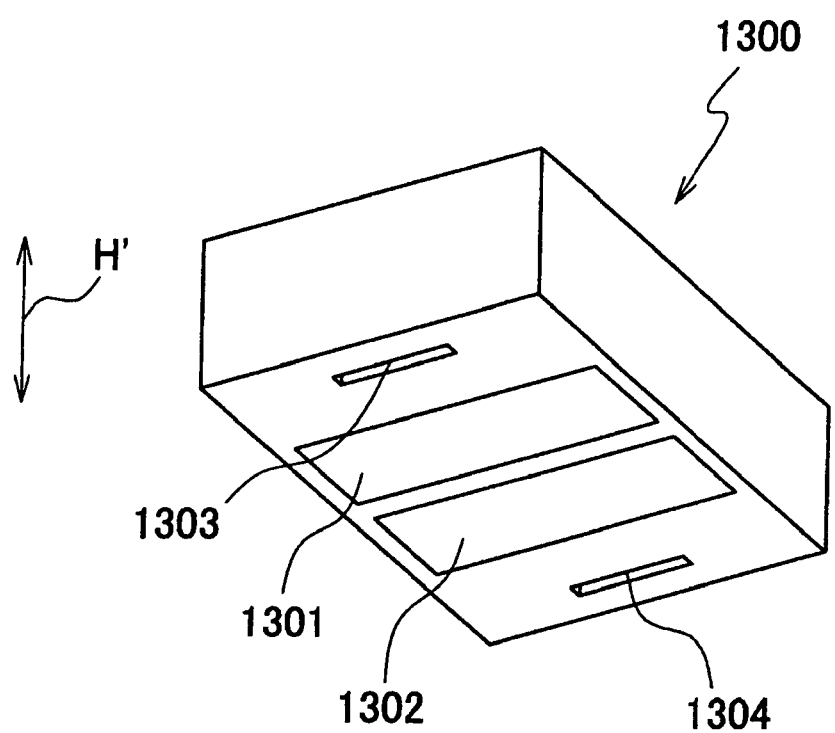
FIG. 13 is a perspective view of the light-emitting diode which is connected to the connector shown in FIG. 12 as viewed obliquely from the bottom.
Figure 14:
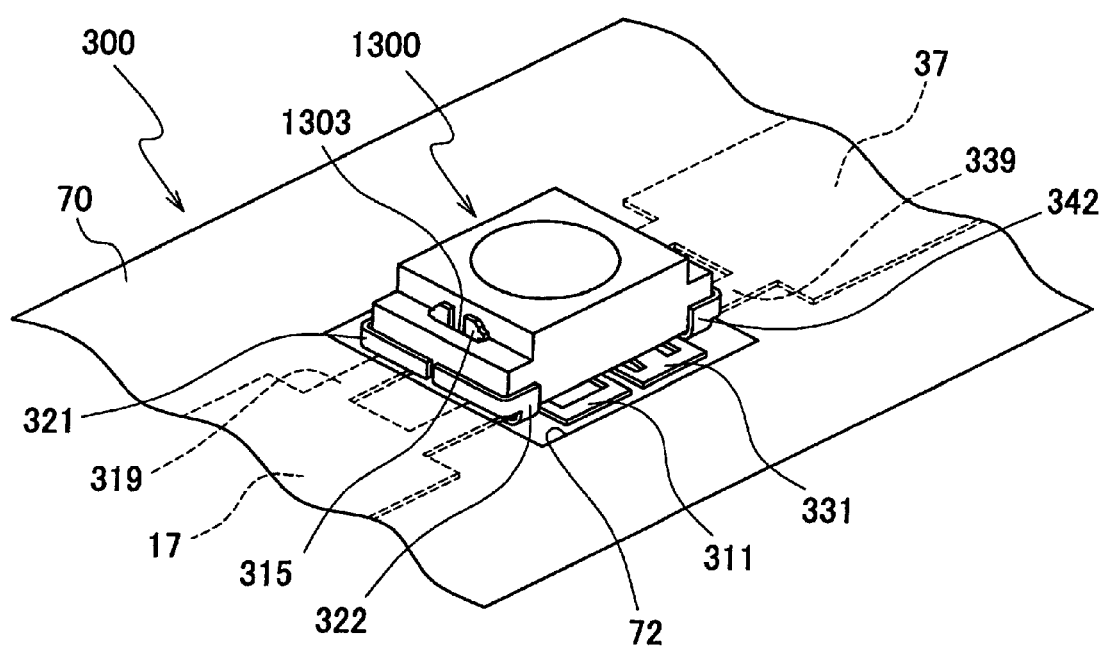
FIG. 14 is a perspective view of the connector shown in FIG. 12 in a state in which the light-emitting diode is connected thereto.
Figure 15:
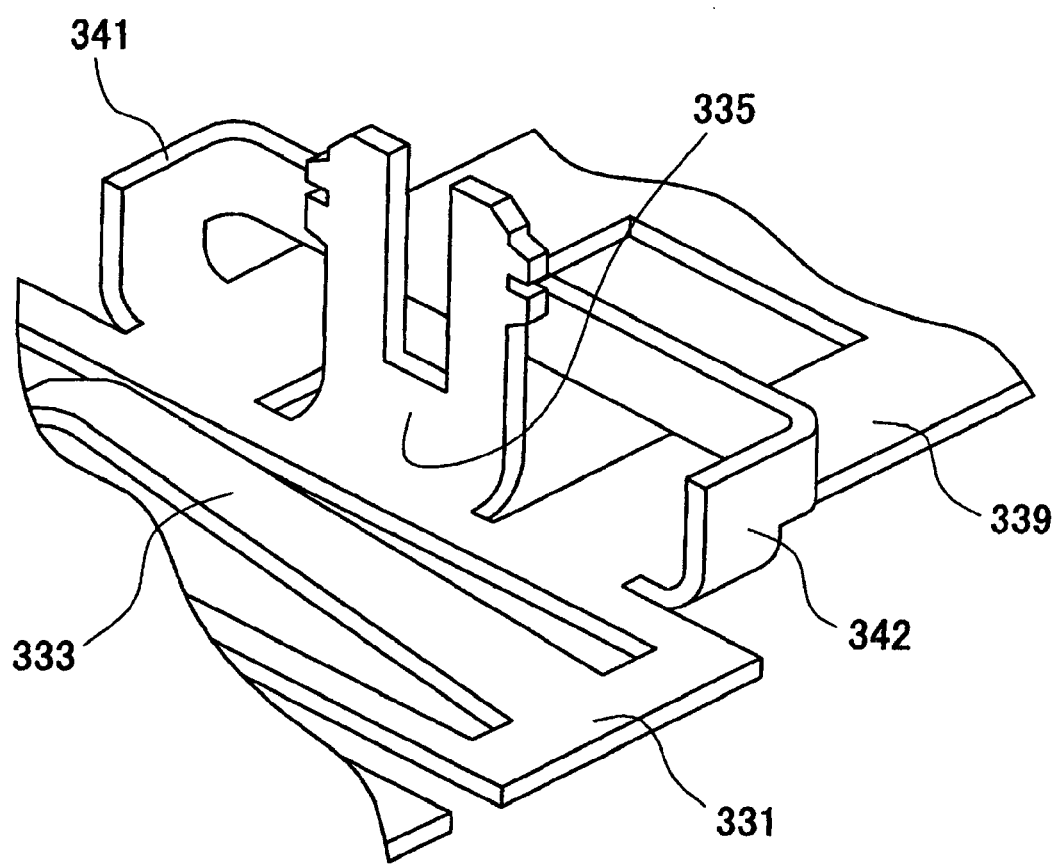
FIG. 15 is an enlarged perspective view of a second engaging portion of the connector shown in FIG. 12.

In the third embodiment, as shown in FIGS. 12 and 15, first and second engaging portions 315 and 335 as first and second holding portions of a pair of contacts 350 are relatively inserted into through holes 1303 and 1304, respectively, which are formed in opposite side portions of a light-emitting diode 1300 (see FIG. 13) as one object to be connected. The through holes 1303 and 1304 are the holes which extend through the light-emitting diode 1300 in a direction H' of the height of the light-emitting diode 1300.

The first engaging portion 315 is bifurcated, which is continuous with a side portion of a first base portion 311 of a first contact 310, and extends in a direction H of the height of a connector 300. The first engaging portion 315 is elastically deformable such that the width between the bifurcated portions of the first engaging portion 315 can be made narrower. The width of a top end portion of the first engaging portion 315 is set to be slightly wider than that of the through hole 1303. Further, the top end portion of the first engaging portion 315 inserted through the through hole 1303 protrudes from the through hole 1303 (see FIG. 14).

The second engaging portion 335 is bifurcated, which is continuous with a side portion of a second base portion 331 of a second contact 330, and extends in the direction H of the height of the connector 300. The second engaging portion 335 is elastically deformable such that the width between the bifurcated portions of the second engaging portion 335 is made narrower. The width of a top end portion of the second engaging portion 335 is set to be slightly wider than that of the through hole 1304. Further, the top end portion of the second engaging portion 335 inserted through the through hole 1304 protrudes from the through hole 1304.

A first contact portion 313 is continuous with a front portion of the first base portion 311, and a second contact portion 333 is continuous with a rear portion of the second base portion 331. Therefore, the first contact portion 313 and the second contact portion 333 are arranged in directions opposite to each other. The first contact portion 313 is brought into contact with a first electrode 1301 (one electrode) formed on a bottom surface of the light-emitting diode 1300, and the second contact portion 333 is brought into contact with a second electrode 1302 (the other electrode) formed on the bottom surface of the light-emitting diode 1300.

A substantially L-shaped frame portion 321 is continuous with a front portion of a linking portion 319, and a substantially L-shaped frame portion 322 is continuous with a rear portion of the linking portion 319. A substantially L-shaped frame portion 341 is continuous with a front portion of a linking portion 339, and a substantially L-shaped frame portion 342 is continuous with a rear portion of the linking portion 339. The frame portions 321, 322, 341, and 342 receive the light-emitting diode 1300 in the direction H of the height.

To connect the light-emitting diode 1300 to the connector 300, it is only required to fit the light-emitting diode 1300 in an area surrounded by the frame portions 321, 322, 341, and 342 along the direction H of the height.

At this time, the first and second engaging portions 315 and 335 are relatively inserted through the through holes 1303 and 1304. Further, when the first and second engaging portions 315 and 335 are relatively inserted through the through holes 1303 and 1304, the widths between the respective bifurcated portions of the first and second engaging portions 315 and 335 are made narrower, and when the top end portions of the first and second engaging portions 315 and 335 protrude from the through holes 1303 and 1304, the widths of the respective bifurcated portions of the first and second engaging portions 315 and 335 return to the original width, whereby the top end portions of the first and second engaging portions 315 and 335 are hooked on the upper surface of the light-emitting diode 1300. As a result, the light-emitting diode 1300 is held by the connector 300.

The first electrode (one electrode) 1301 of the light-emitting diode 1300 held by the first and second engaging portions 315 and 335 is brought into contact with the first contact portion 313, and the second electrode (the other electrode) 1302 is brought into contact with the second contact portion 333, respectively.

To remove the light-emitting diode 1300 held by the first and second engaging portions 315 and 335 from the connector 300, it is only necessary to make the widths of the respective bifurcated portions of the first and second engaging portions 315 and 335 narrower to disengage the top end portions of the first and second engaging portions 315 and 335 from the upper surface of the light-emitting diode 1300, and pull up the light-emitting diode 1300 from the connector 300.

According to the third embodiment, it is possible to obtain the same advantageous effects as provided by the first embodiment, and it is possible to fit and remove the light-emitting diode 1300 in the direction H of the height by the first and second engaging portions 315 and 335. Therefore, even if the plurality of connectors 300 are arranged in a front-rear direction F of the connector 300, it is possible to easily fit and remove the light-emitting diodes 1300.

It should be noted that although the connectors 100, 200, and 300 of the above-described embodiments each include the plurality of pairs of contacts 50, 250, and 350, it is also possible to apply the present invention to a connector comprised of one pair of contacts.

Further, although the insulating member 60 of the connectors 100, 200, and 300 of the above-described embodiments is comprised of the upper insulating film 70 and the lower insulating film 80, the insulating member may be comprised of only the lower insulating film.

It should be noted that although in the connector 100 of the above-described embodiment, the first and second holding portions and the like are exposed by providing the window holes 72 in one upper insulating film 70, a plurality of upper insulating films may be affixed to the upper surfaces of the connector 100, 200, and 300 such that they do not cover the first and second holding portions. In this case, a space between the adjacent upper insulating films becomes an exposing portion.

Further, one object to be connected is not limited to a light-emitting diode, and the other object to be connected is not limited to a power supply.

Although in the above-described embodiments, the upper insulating film 70 and the lower insulating film 80 are affixed with glue or double-sided tape, the upper insulating film 70 and the lower insulating film 80 may be welded or heat-sealed using ultrasonic sealing or laser.

It is further understood by those skilled in the art that the foregoing are the preferred embodiments of the present invention, and that various changes and modification may be made thereto without departing from the spirit and scope thereof.

What is claimed is:

1. A connector comprising:
    a first contact including a first contact portion which is configured to be brought into contact with one electrode of one object to be connected, a first holding portion which is configured to hold the one object to be connected so that a state in which the one object to be connected is pushed against the first contact portion is maintained, and a first connection portion which is configured to be connected to another object to be connected;
    a second contact including a second contact portion which is configured to be brought into contact with another electrode of the one object to be connected, a second holding portion which is configured to hold the one object to be connected so that a state in which the one object to be connected is pushed against the second contact portion is maintained, and a second connection portion which is configured to be connected to the other object to be connected; and
    an insulating member that holds said first contact and said second contact with a predetermined spacing therebetween, said insulating member including a lower insulating film which is affixed to lower surfaces of said first and second contacts.

2. The connector as claimed in claim 1, wherein each of said first and second holding portions is a supporting portion which is configured to receive the one object to be connected from a direction orthogonal to a direction of a thickness of said lower insulating film, and to support the one object to be connected in the direction of the thickness of said lower insulating film, and
    wherein each of said first and second contacts each includes a positioning portion which is configured to position the one object to be connected, which is received from the direction orthogonal to the direction of the thickness of said lower insulating film, and a retaining portion which is configured to prevent the one object to be connected, which is positioned by said positioning portion, from coming off in the direction orthogonal to the direction of the thickness of said lower insulating film.

3. The connector as claimed in claim 1, wherein said first and second holding portions are press-fitting portions which are configured to be relatively press-fitted into respective holes formed in the one object to be connected, in a direction of a thickness of said lower insulating film.

4. The connector as claimed in claim 1, wherein said first and second holding portions are bifurcated engaging portions which are configured to be relatively inserted while being elastically deformed into respective through holes formed in the one object to be connected, in a direction of a thickness of said lower insulating film, and are configured to be engaged with an upper surface of the one object to be connected.

5. The connector as claimed in claim 1, wherein said insulating member includes an upper insulating film which is affixed to upper surfaces of said first and second contacts, and
    wherein said upper insulating film includes an exposing portion which causes at least said first and second contact portions and said first and second holding portions to be exposed.

6. The connector as claimed in claim 1, wherein said insulating member includes an upper insulating film which is affixed to upper surfaces of said first and second contacts,
    wherein said upper insulating film includes an exposing portion which causes at least said first and second contact portions, and said first and second holding portions to be exposed,
    wherein said first and second contacts are provided with carriers which are separated from said first and second contacts, on opposite sides thereof, and
    wherein said lower insulating film is affixed to lower surfaces of said carriers, and said upper insulating film is affixed to upper surfaces of said carriers.

7. A connector comprising:
    (i) a plurality of pairs of contacts, each pair being formed by a first contact and a second contact arranged with a predetermined spacing therebetween,
    said first contact including a first contact portion which is configured to be brought into contact with one electrode of one object to be connected, a first holding portion which is configured to hold the one object to be connected so that a state in which the one object to be connected is pushed against the first contact portion is maintained, and a first connection portion which is configured to be connected to another object to be connected,
    said second contact including a second contact portion which is configured to be brought into contact with another electrode of the one object to be connected, a second holding portion which is configured to hold the one object to be connected so that a state in which the one object to be connected is pushed against the second contact portion is maintained, and a second connection portion which is configured to be connected to the other object to be connected, and said first connection portion of said first contact of one of two adjacent pairs of said plurality of pairs of contacts being connected to said second connection portion of said second contact of the other of said two adjacent pairs; and (ii) an insulating member that holds said plurality of pairs of contacts, said insulating member including a lower insulating film which is affixed to lower surfaces of said first and second contacts.

8. The connector as claimed in claim 7, wherein each of said first and second holding portions is a supporting portion which is configured to receive the one object to be connected from a direction orthogonal to a direction of a thickness of said lower insulating film, and to support the one object to be connected in the direction of the thickness of said lower insulating film, wherein each of said first and second contacts includes a positioning portion which is configured to position the one object to be connected, which is received from the direction orthogonal to the direction of the thickness of said lower insulating film, and a retaining portion which is configured to prevent the one object to be connected, which is positioned by said positioning portion, from coming off in the direction orthogonal to the direction of the thickness of said lower insulating film.

9. The connector as claimed in claim 7, wherein said first and second holding portions are press-fitting portions which are configured to be relatively press-fitted into respective holes formed in the one object to be connected, in a direction of a thickness of said lower insulating film.

10. The connector as claimed in claim 7, wherein said first and second holding portions are bifurcated engaging portions which are configured to be relatively inserted while being elastically deformed into respective through holes formed in the one object to be connected, in a direction of a thickness of said lower insulating film, and are configured to be engaged with an upper surface of the one object to be connected.

11. The connector as claimed in claim 7, wherein said insulating member includes an upper insulating film which is affixed to upper surfaces of said first and second contacts, and wherein said upper insulating film includes an exposing portion which causes at least said first and second contact portions and said first and second holding portions to be exposed.

12. The connector as claimed in claim 7, wherein said insulating member includes an upper insulating film which is affixed to upper surfaces of said first and second contacts, wherein said upper insulating film includes an exposing portion which causes at least said first and second contact portions, and said first and second holding portions to be exposed, wherein said first and second contacts are provided with carriers which are separated from said first and second contacts, on opposite sides thereof, and wherein said lower insulating film is affixed to lower surfaces of said carriers, and said upper insulating film is affixed to upper surfaces of said carriers.

* * * * *